United States Patent
Goldstein et al.

(10) Patent No.: US 9,515,629 B2
(45) Date of Patent: Dec. 6, 2016

(54) ADAPTIVE AUDIO EQUALIZATION FOR PERSONAL LISTENING DEVICES

(71) Applicant: Apple Inc., Cupertino, CA (US)

(72) Inventors: Andre L. Goldstein, San Jose, CA (US); Vladan Bajic, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 633 days.

(21) Appl. No.: 13/896,164

(22) Filed: May 16, 2013

(65) Prior Publication Data
US 2014/0341388 A1  Nov. 20, 2014

(51) Int. Cl.
*A61F 11/06* (2006.01)
*H03G 5/16* (2006.01)
(Continued)

(52) U.S. Cl.
CPC ........... *H03G 5/165* (2013.01); *G10K 11/1786* (2013.01); *H04R 1/1083* (2013.01);
(Continued)

(58) Field of Classification Search
CPC ............... H04R 3/02; H04R 3/04; H04R 3/06; H04R 3/08; H04R 3/14; H04R 3/007; H04R 5/04; H04R 25/453; H04R 25/50; H04R 25/505; H04R 25/507; H04R 1/1091; H04R 1/10; H04R 1/08; H04R 29/001; H04R 3/00; H04R 3/002; H04R 2420/07; H04R 2499/11; H04R 2217/03; H04R 2225/41; H04R 2225/43; H03G 5/00; H03G 5/005; H03G 5/16; H03G 5/165; H03G 5/24; H03G 5/28; H03G 9/005; H03G 9/24; H03G 9/025; H03G 2201/702; H03G 7/007; G06F 3/165; G06F 17/3074; G10K 11/175; G10K 11/16
(Continued)

(56) References Cited

U.S. PATENT DOCUMENTS 3,668,322 A * 6/1972 Allen ................. H03G 5/22
381/102
2001/0053228 A1 12/2001 Jones
(Continued)

FOREIGN PATENT DOCUMENTS

EP          2583074 A1    4/2013
WO   WO-2011159858 A1   12/2011
(Continued)

OTHER PUBLICATIONS

PCT/US2014/035311—Notification Concerning Transmittal of International Preliminary Report on Patentability dated Nov. 26, 2015.
(Continued)

*Primary Examiner* — Leshui Zhang
(74) *Attorney, Agent, or Firm* — Blakely, Sokoloff, Taylor & Zafman LLP

(57) ABSTRACT

An audio processor has an active noise cancellation (ANC) processor to compute an S-filter, which estimates a transfer function from an earpiece speaker, that is to be worn by a user, to an error microphone. The ANC processor adaptively produces an anti noise signal for reducing ambient noise that can be heard by the user. An adaptive equalization (EQ) processor has an EQ filter controller that adjusts an EQ filter, while audio user content is being filtered in accordance with the EQ filter before being fed to the speaker and then heard by the user. Other embodiments are also described and claimed.

17 Claims, 7 Drawing Sheets

(51) Int. Cl.
*H04R 1/10* (2006.01)
*H04R 3/04* (2006.01)
*G10K 11/178* (2006.01)

(52) U.S. Cl.
CPC ....... *H04R 3/04* (2013.01); *G10K 2210/1081* (2013.01); *G10K 2210/3028* (2013.01); *G10K 2210/3055* (2013.01); *G10K 2210/51* (2013.01); *H04R 2410/05* (2013.01); *H04R 2499/11* (2013.01)

(58) Field of Classification Search
USPC ......... 381/28, 59, 55, 317, 318, 321, 74, 72, 26,381/56, 57, 71.1–71.13, 83, 332, 93, 96, 97, 98,381/99, 100, 101, 102, 103, 106, 107, 108, 120,381/121; 327/551, 552, 553, 555, 560; 704/E21.007, E21.02; 379/406.01–406.16; 455/570; 700/94
See application file for complete search history.

(56) References Cited

U.S. PATENT DOCUMENTS

| | | | | |
|---|---|---|---|---|
| 2008/0181422 | A1* | 7/2008 | Christoph | G10K 11/1784 381/73.1 |
| 2011/0142247 | A1* | 6/2011 | Fellers | G10K 11/178 381/71.1 |
| 2011/0293103 | A1 | 12/2011 | Park et al. | |
| 2012/0063615 | A1* | 3/2012 | Crockett | G10L 21/0364 381/98 |
| 2012/0250873 | A1 | 10/2012 | Bakalos et al. | |

FOREIGN PATENT DOCUMENTS

| | | | |
|---|---|---|---|
| WO | WO 2011159858 A1 * | 12/2011 | ........... G10K 11/178 |
| WO | WO-2012050705 A1 | 4/2012 | |

OTHER PUBLICATIONS

PCT International Search Report and Written Opinion (dated Sep. 5, 2014), International Application No. PCT/US2014/035311, International Filing Date—Apr. 24, 2014, (12 pages).

Kuo, Sen M., et al., "Active Noise Control: A Tutorial Review", Publication Title Proceedings of the IEEE, Posted Online Aug. 6, 2002, vol. 87, Issue 6, (pp. 943-973).

Park, Sung J., et al., "Active Noise Control for Headset Using Virtual Error Estimator and RMS Delay Spread", International Conference on Electronics, Biomedical Engineering and its Applications (ICEBEA '2012) Jan. 7-8, 2012 Dubai, (pp. 322-325).

Schumacher, Thomas, et al., "Active Noise Control in Headsets: A New Approach for Broadband Feedback ANC", ICASSP 2011, IEEE 978-1-4577-0539-7/11, (pp. 417-420).

* cited by examiner

ADAPTIVE AUDIO EQUALIZATION FOR PERSONAL LISTENING DEVICES

FIELD

An embodiment of the invention relates to an audio processor suitable for use in personal listening devices that has adaptive equalization (EQ) capabilities. Other embodiments are also described.

BACKGROUND

It is often desirable to use personal listening devices when listening to music and other audio material, in order to not disturb others that are nearby. For example, users often use headphones, such as a wired headset or a wireless headset, when listening to music that is being played back from a portable music player, or when conducting a conversation with another user during a voice or video telephony call. Some times, over the ear earphones are used, particularly in environments in which size or bulk is not a major concern. When a more compact profile is desired, users often elect to use in-ear headphones, some times referred to as earbuds.

In order to provide a form of passive barrier against ambient noise, headphones are often designed to form some level of acoustic seal with the ear of the wearer. With loose fitting earbuds, however, the audio frequency response and the overall quality of the desired user audio content that is heard varies substantially from user-to-user. This is due to different degrees of acoustic seal that is achieved around an earpiece speaker against the ear. This may be due to several reasons, including geometrical variations of the ear shapes, and placement variation due to physical activities while using the earpiece, for example, shifting of loose fitting earbuds during walking or running or simply during certain positions of use such as while lying down.

A certain amount of acoustic leakage, that is leakage of the ambient noise into the ear canal, may be built into the earphone by design, to avoid the feeling of acoustic occlusion and also for improving comfort (relative to a tightly or completely sealed earphone design). However, a leaky acoustic design often results in the undesirable effect of inconsistent low frequency or bass response, between different users and in different wearing positions. In addition, the leaky acoustic design also has poor passive acoustic attenuation which leads to generally lower quality user experience of the desired user audio content, due to low signal-to-noise ratio or low speech intelligibility in environments with high ambient or background noise levels.

SUMMARY

An embodiment of the invention aims to improve user experience when using personal listening devices, by combining active noise cancellation (ANC) and adaptive audio equalization (EQ) in a personal listening device that may exhibit substantial acoustic leakage, so as to provide the user a better listening experience with consistent low frequency or bass response, while attenuating external or ambient background noise that would otherwise be heard by the user. An embodiment of the invention is an audio processor that has an ANC processor and an adaptive EQ processor that operate together and simultaneously during a phone call or during audio playback, to help improve sound quality in a personal listening device that for example uses a loose fitting earbud. The ANC processor computes an S-filter, which estimates the transfer function from an earpiece speaker of a personal listening device, that is to be worn by a user, to an error microphone. A processor adaptively produces an anti-noise signal for reducing ambient noise that may be heard by the user.

The EQ processor has an EQ-filter controller that adaptively adjusts a special EQ-filter, which may be designed to compensate for the effects of variable acoustic seal around the earpiece speaker worn by the user, in order yield more consistent bass response for example across different fits against the user's ear. The EQ adaptation occurs while audio user content is being passed through a copy of the EQ-filter before being fed to the speaker and then heard by the user. In one embodiment, a dummy signal passes through the EQ-filter and through a copy of the S-filter, and is then provided to the EQ-filter controller, based on which the EQ-filter controller adaptively adjusts the EQ-filter. In one version of this embodiment, the EQ-filter controller compares the signal strengths in at least a low frequency band and a high frequency band of the EQ- and S-filtered dummy signal, to determine how to adjust the EQ filter. In another version, the EQ-filter controller computes the signal strength in only one band, ostensibly a frequency band of interest in which there is substantial variation in the acoustic loading of the speaker (due to the variable acoustic seal against the user's ear).

In another embodiment of the EQ processor, no dummy signal is needed, and the EQ-filter controller computes the frequency responses of the present EQ filter and the present S-filter and uses them to determine how to adjust the EQ filter.

In yet another embodiment, the adaptive EQ processor can be used as a standalone unit, i.e. as part of an audio processor without ANC that nonetheless adaptively updates the S-filter while simultaneously using a copy of the S-filter to adapt the EQ filter.

In another embodiment, the EQ processor relies upon both the present audio user content and the signal from the error microphone, to determine how to adjust the EQ filter, but does not rely upon an estimate of the transfer function between the earpiece speaker and the error microphone (e.g., the S-filter). In such an embodiment, frequency domain processing may be performed on a per frequency bin basis to compute power in the speaker signal and power in the error microphone signal in a given bin, compare the computed powers, and on that basis adjust gain of the EQ filter (in that bin).

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

FIG. 3B is a block diagram of an adaptive EQ processor that uses a dummy signal and a copy of an S-filter to update an adaptive EQ filter.

DETAILED DESCRIPTION

Several embodiments of the invention with reference to the appended drawings are now explained. While numerous details are set forth, it is understood that some embodiments of the invention may be practiced without these details. In other instances, well-known circuits, structures, and techniques have not been shown in detail so as not to obscure the understanding of this description.

Figure 1:
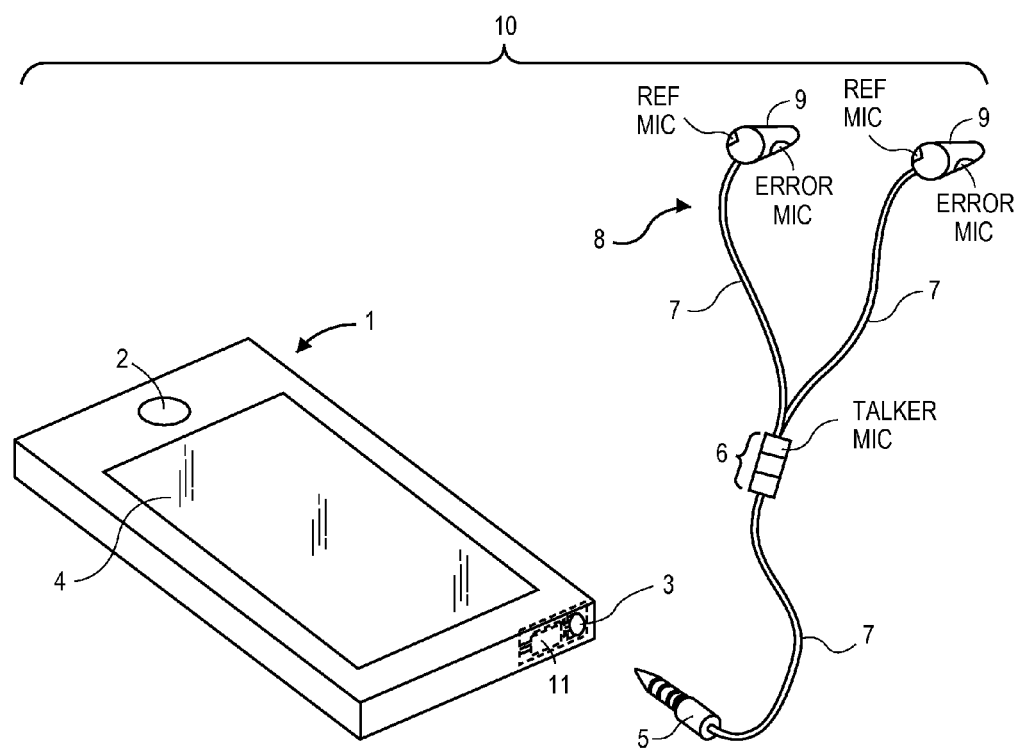
FIG. 1 is a perspective view of an example personal listening device in which an embodiment of the invention can be implemented.

Referring to FIG. 1, an example of an audio device or system 10 is shown in which an audio processor in accordance with embodiment of the invention may be implemented. In this case, the system 10 has a separate audio source device 1 which may be that of a portable consumer electronic device, such as a smartphone, cellular phone, laptop computer, tablet computer, or other battery powered electronic audio device that can be easily carried by its user and has a touchscreen 4 and a menu button 2. The system 10 also has a separate accessory 8 that is to be coupled to the source device 1 for audio signal purposes, which in this case is a wired headset having a pair of earpiece speakers 9 that are located in respective earphone housings, as shown. The earphones may be a partially sealing or a loose fitting type. The earphone housing may or may not have an elastomeric material on its periphery that at least partially seals with the user's ear. In another embodiment, no such elastomeric material is provided. The earphone housing may have a rigid external surface that is sized and shaped to fit comfortably, yet loosely, within the ear canal of the user (referred to sometimes as a loose fitting earbud). The accessory 8 in this case can be connected electrically to the source device 1 through an electrical cable 7 at the end of which a plug or connector 5 is attached. The latter may mate with a counterpart accessory jack 3 that may be built into the housing of the source device 1, as shown. In addition to the earpiece speaker 9, the headset 8 may also have a talker microphone that may be built into a separate housing 6 that is positioned on the cable 7 between the earphones and the connector 5. This housing 6 may also include physical switches that can be actuated by the user to send a control signal through the cable 7 to the source device 1, e.g. a pause or resume signal during audio playback, an answer or hang-up signal during a phone call.

Each earphone may also include, in addition to the earpiece speaker 9, a reference microphone and an error microphone. The error microphone may be mounted within the same housing that contains the earpiece speaker 9, and is located near an ear entrance point. As such, it may be an acoustic pickup that measures the sound pressure within the user's ear cavity, which may include a contribution from leaked ambient or background noise that is intended to be canceled by an anti-noise signal produced by the ANC processor. This may be used to provide an error signal for input to the ANC processor. The reference microphone may be located at an opposite end of the housing that contains the error microphone and the earpiece speaker, or elsewhere where it can pick up the ambient noise earlier than the error microphone. A signal from the reference microphone is used as a reference signal by the ANC processor. It should be noted that there may be additional microphones, such that the system may use more than one error microphone or more than one reference microphone, to produce the error and reference signals needed by the ANC processor.

Still referring to FIG. 1, the audio processor, which includes an ANC processor and an adaptive EQ processor, may be implemented entirely within the discrete time or digital domain, as digital signal processing circuitry that is physically located within the housing of the source device 1. As an alternative, however, it should be noted that parts of the audio processor may be implemented outside of the housing of the source device 1, such as within the housing 6 that is part of the accessory 8. In most cases, the system 10 also contains an audio signal interface circuit 11, which is to receive audio signals from the reference microphone and the error microphone and prepare them (e.g., digitize them into sequential frames) for processing by the ANC processor. In addition, the audio signal interface circuit 11 may send an audio signal that contains user audio content, either in digital or analog form, to the accessory 8, to be ultimately converted into sound by the earpiece speaker 9. In the embodiment of FIG. 1, the audio signal interface circuit 11 may be an audio codec integrated circuit that has audio analog-to-digital conversion circuitry and audio digital-to-analog conversion circuitry, and is connected through a wired interface, that is through the accessory jack 3 and the mating connector 5, to the error and reference microphones and to the earpiece speaker 9. In another embodiment, the audio signal interface circuit 11 may be an interface to a wireless digital audio link that uses, for example, a Bluetooth or other short range wireless digital communications protocol, to receive microphone signals from and send a speaker signal to a wireless headset (not shown).

Figure 2A:
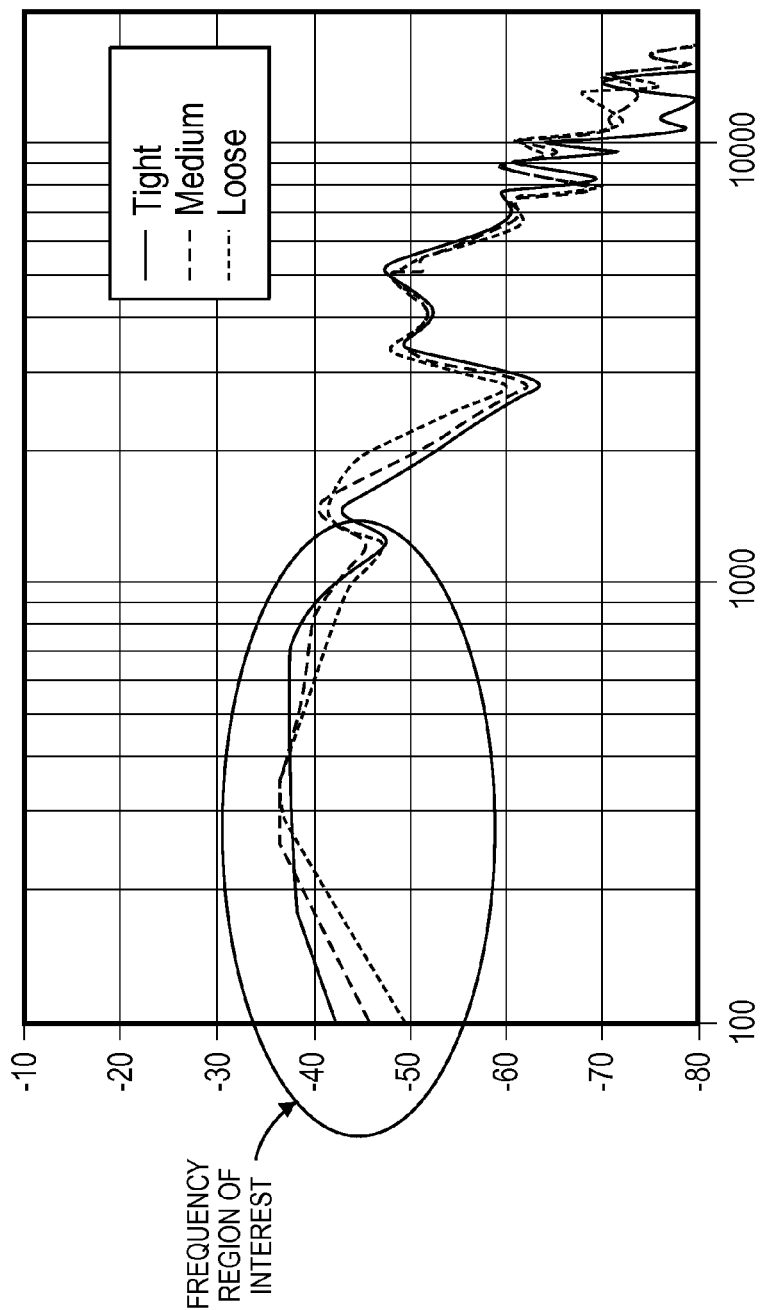
FIG. 2A is a chart illustrating the results of how an adaptive EQ filter reduces differences in frequency response of personal listening devices having different degrees of acoustic leakage.
Figure 2B:
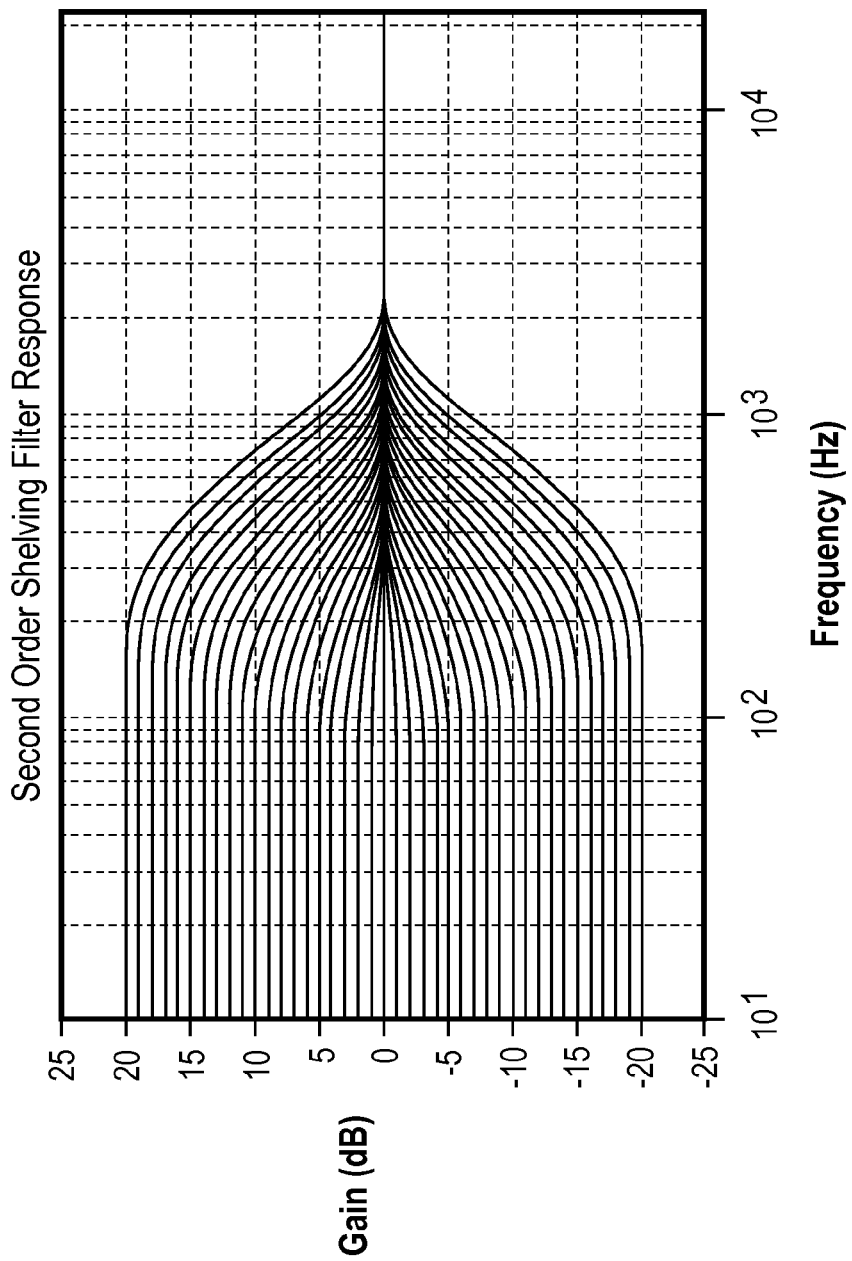
FIG. 2B shows magnitude frequency response curves for an example adaptive EQ filter.

Having described an example personal listening device, it is instructive to recall that variability in the acoustic seal around the earpiece speaker (against the user's ear) causes substantial differences in the audio frequency response of the personal listening device, as measured, for example, at a drum reference point (DRP) of a testing mannequin in a laboratory setting (which represents the user's eardrum). FIG. 2A illustrates how the audio frequency response for three different levels of acoustic seal around the earpiece speaker can vary. It can be seen that most of the variability in the frequency response occurs in a low frequency band, in this particular example only, about between DC and less than 1100 Hz. In certain higher frequency ranges, and depending upon the position of the error microphone, the way the device fits against the user's ear, and the user's ear canal, the frequency response may remain relatively stable. The problems occur at the low frequencies or bass region and it has therefore been suggested to use a low frequency shelving or shelf filter as part of the EQ filter, through which the user audio content is passed before input to the speaker, in order to compensate for or provide some level of boost to the frequency response in that region. The low frequency shelving filter may be a variable digital filter that has a knee frequency fixed at about 1 kHz, but with variable gain being available in a low frequency band, while providing essentially no gain (or zero dB) above about 1 kHz. Examples of low frequency shelving filter frequency responses are depicted in FIG. 2B, in this case second order filters that may be implemented using a programmable, biquad digital filter structure.

As described in more detail in connection with for example FIG. 3B, an automatic process referred to as an adaptive EQ process and an adaptive EQ-filter controller periodically determines how much to adjust for example the gain of the low frequency shelving filter, by selecting one of several predetermined gains that are available, such as those depicted in FIG. 2B. The adaptive EQ process (or updating of the EQ filter) is performed "on-line" or in real-time, i.e. while the user audio content is being converted into sound. The selected gain depends on the level of acoustic leakage that has effectively been detected by the adaptive EQ process. Several techniques for doing so are described below, in the context of a digital EQ-filter controller, as part of an audio EQ processor. The structure is an adaptive EQ processor in that it dynamically computes updates to the variable EQ filter (e.g., only the gain of a variable-gain low frequency shelving filter), i.e. repeatedly during normal, in-the-field use of the personal listening device.

Figure 3:
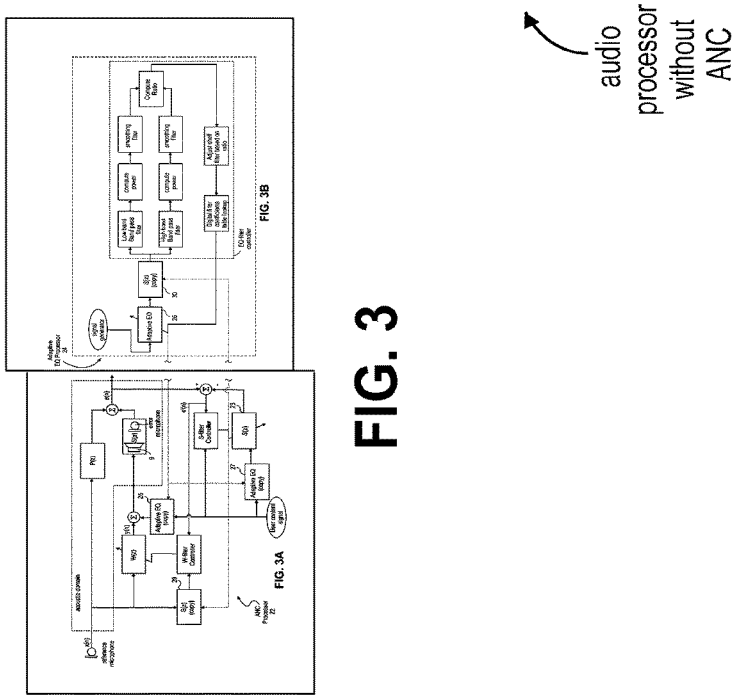
FIG. 3 is a block diagram of an ANC processor that incorporates an adaptive EQ filter and an adaptive EQ processor that uses a dummy signal and a copy of an S-filter to update the adaptive EQ filter, presented as the partial views of FIGS. 3A and 3B.

In one embodiment of the invention, the audio processor has two components, namely an ANC processor 22 an example of which is depicted in FIG. 3A, and an adaptive EQ processor 24 such as the one depicted in FIG. 3B. Beginning with the ANC processor 22 in FIG. 3A, this processor computes a digital S-filter 23, indicated as having transfer function S(z), that estimates the transfer function of or models a path from the earpiece speaker 9 to the error microphone, while the person listening device is in normal use by the user. This transfer function is sometimes referred to as the secondary path transfer function, in contrast to a primary path transfer function P(z) which refers to the acoustic path taken by ambient or background noise that enters the user's ear canal after passing through the partial or incomplete acoustic seal that is formed around the earpiece speaker 9. The S-filter 23 may be computed by an S-filter controller, which may implement any suitable adaptive control algorithm or process such as, for example, least mean square (LMS) or other adaptive gradient descent algorithm. In this case, the S-filter 23 is being used by an adaptive feed forward algorithm or process, and in particular a filtered-x LMS algorithm in which a copy of the S-filter 23, namely S(z) copy 29, generates the filtered-x input to a W-filter controller. The latter, which may also implement an LMS adaptive algorithm, computes a W-filter having transfer function W(z). An anti-noise signal y(n) is produced by the W-filter while its input receives a version of a reference signal x(n) that is produced by the reference microphone. The W-filter is adaptively updated, by the W-filter controller, online or in real-time. In this manner, the W-filter produces an anti-noise signal y(n) by filtering the reference signal x(n), where the anti-noise signal is continually being adapted to acoustically cancel the ambient noise that can be heard by the user (once converted to sound by a speaker such as the earpiece speaker 9).

Note that each of the S-filter controller and the W-filter controller, in this embodiment, use an error signal e'(n) derived from the signal produced by the error microphone, e(n). The error signal e'(n) may be generated by a differencing unit as shown, whose inputs are the signal from the error microphone and an output of the S-filter 23 as it is being adapted. Adaptation of the S-filter 23 may also need knowledge of the "clean" user audio content signal, which is delivered as shown in FIG. 3A to another input of the S-filter controller. The user content audio signal may for example be a playback signal (such as from a locally stored encoded audio program file or from a remote source via Internet streaming), or it may be a real-time communications downlink signal (such as from a plain old telephone service network, a cellular phone network or an Internet Protocol telephony network).

Still referring to FIG. 3A, it can be seen that the audio signal presented to the input of the earpiece speaker 9 has passed through an adaptive EQ filter, referred to here as adaptive EQ (copy) 25 which is a copy of an adaptive EQ filter 26 that is being computed online by the adaptive EQ processor 24—see e.g., FIG. 3B. There is also another adaptive EQ filter, namely adaptive EQ (copy) 27, which is also a copy of the EQ filter 26, through which the user audio content signal is to pass before being fed to an input of the S-filter 23 that is being adapted or computed. The adaptive EQ filter copies 25, 27 are digital filters that may be copies of an adaptive EQ filter 26 that is being computed or adapted by the adaptive EQ processor 24 such as the one depicted in FIG. 3B.

Turning now to FIG. 3B, the adaptive EQ processor 24 has an EQ-filter controller that is to adaptably adjust an adaptive EQ filter 26, whose copies are used in the ANC processor 22 that is running simultaneously (as described above in connection with FIG. 3A). In this embodiment, a dummy signal, here indicated as being produced by a signal generator, passes through an adaptive EQ filter 26, and through a copy of the S-filter, S(z) copy 30, before arriving at the input to the EQ-filter controller. It should be noted that in instances where the adaptive EQ filter and the S-filter S(z) are linear systems, their order may at times be interchanged; in that case, the dummy signal could alternatively pass through the S-filter S(z) copy 30 before passing through the adaptive EQ filter 26 (and then arriving at the input of the EQ-filter controller). In both cases, the EQ-filter controller adaptively computes or adjusts or updates the EQ filter 26, based on the filtered dummy signal.

The EQ-filter controller performs a process that determines the digital filter coefficients of the EQ filter 26 online or in real-time, that is while user audio content is being converted into sound. In a particular case, the dummy signal is a white noise signal but it could alternatively be a pink noise signal or another full-audio-band signal which is fed to the cascaded series of the EQ filter 26 and the S(z) copy 30. In the embodiment of FIG. 3B, the EQ filter controller isolates at least two audio frequency bands of the filtered dummy signal, namely a low band and a high band, using respective bandpass filters (low band filter and high band filter as shown). The output from each bandpass filter is then processed to compute signal strength. Here, a generic reference is made to computing the "power", which is understood to encompass computing the energy or other metric representing the strength of the signal content within the isolated frequency band. It should also be noted that since implementation of the EQ-filter controller in this case is in the digital domain, the computation of power in each frequency band may be based on computing the time average of energy (or energy per unit time) over a given digital audio frame, where it should be understood that the digital signal processing by the ANC processor and by the EQ processor is performed upon a sequence of frames of digitized audio. With that in mind, the EQ filter controller may also have a smoothing filter, which operates to smooth a sequence of power values that were computed for a sequence of frames, respectively. The smoothing may serve to for example soften the variation across frames. As an example, the smoothing operation may apply the conventional single exponential smoothing function that uses a constant or parameter α (called the smoothing constant). Thus, the smoothing operation or smoothing filter here refers to smoothing of the computed power values over time.

Once the smoothed power values for each frequency band of a given frame have been calculated, they are compared to each other. In this example this is done by computing their ratio, and then comparing the ratio to a desired, target or threshold ratio. The target power ratio may have been determined through empirical testing (during product development within a laboratory, for example), by measuring the frequency response of different instances of mannequin-use of the personal listening device (see FIG. 2A), and finding a suitable target ratio based on the measured frequency responses. A relationship may be computed that relates a) a difference between the target ratio and any departure from the target, and b) the frequency response of the EQ filter 26 that is expected to compensate for the difference. More specifically, the relationship attempts to define a way to adjust the EQ filter 26 so as to attempt to achieve the desired goal of presenting relatively consistent or similar audio frequency response to the user (within a frequency region of interest), regardless of the level of acoustic seal around the earpiece speaker 9. See FIG. 2A which shows an example of the results of applying an EQ filter in order to bring the frequency responses within a region of interest closer to each other, for three different earphone "fits" with the user's ear.

In one embodiment, the frequency responses that are available from the adaptive EQ filter 26 may be restricted to be those of a low frequency shelf filter with variable gain only, i.e. fixed cutoff or knee frequency. In that case, the EQ-filter controller adjusts the EQ filter 26, by selecting the gain of a low frequency shelf filter, based on the computed ratio of the smoothed low band and high band powers. See FIG. 2B for an example of several such frequency responses that may be made available by the EQ filter 26. Once the shelving filter frequency response has been selected, a lookup may be performed upon a predetermined table, to determine the digital filter coefficients that yield such a shelving filter frequency response. The selected digital filter coefficients are then applied to update the structure of the digital EQ filter 26. This also results in copies of the EQ filter 26, namely, the adaptive EQ copies 25, 27 in FIG. 3A, being automatically updated, during the online process being performed by the ANC processor 22.

Note that in the particular example EQ-filter controller shown in FIG. 3B, only two frequency bands are defined, namely a low frequency band and a high frequency band, where each of these bands may be isolated by a respective bandpass filter. More generally however, there may be more than two distinct bands whose powers can be computed and then smoothed and then compared to each other, e.g. by defining a suitable combination as a metric that is compared to a predetermined threshold, to allow the algorithm to in effect detect a given acoustic fit scenario. In addition, while a low frequency shelving filter with adjustable gain may generally be sufficient to equalize the audio frequency response of the system (see FIG. 2A), and in particular one that uses an infinite impulse response (IIR) second order shelving filter with variable gain and fixed knee or cutoff frequency, an alternative is to have a different type of EQ filter 26 such as one that has both variable gain and variable knee frequency.

It should be noted that the technique described here in connection with FIG. 3B for the EQ-filter controller process is different from that described in U.S. patent application Ser. No. 13/631,475, filed Sep. 28, 2012, entitled "Audio Headset with Automatic Equalization". For example, the technique here does not rely on the signal e(n) from the error microphone (when adjusting the EQ filter 26 to compensate for low frequency or bass loss due to acoustic leakage).

It should also be noted that in the embodiment of FIG. 3A the special EQ filter operation is not applied to the anti-noise signal y(n). In this case, the anti-noise signal is combined with the user audio content coming from the adaptive EQ filter (copy) 25, before being fed to the speaker 9. Also, the reference signal x(n) passes through an S-filter, namely S(z) copy 29, but without the special EQ filter operation applied to it.

Figure 4:
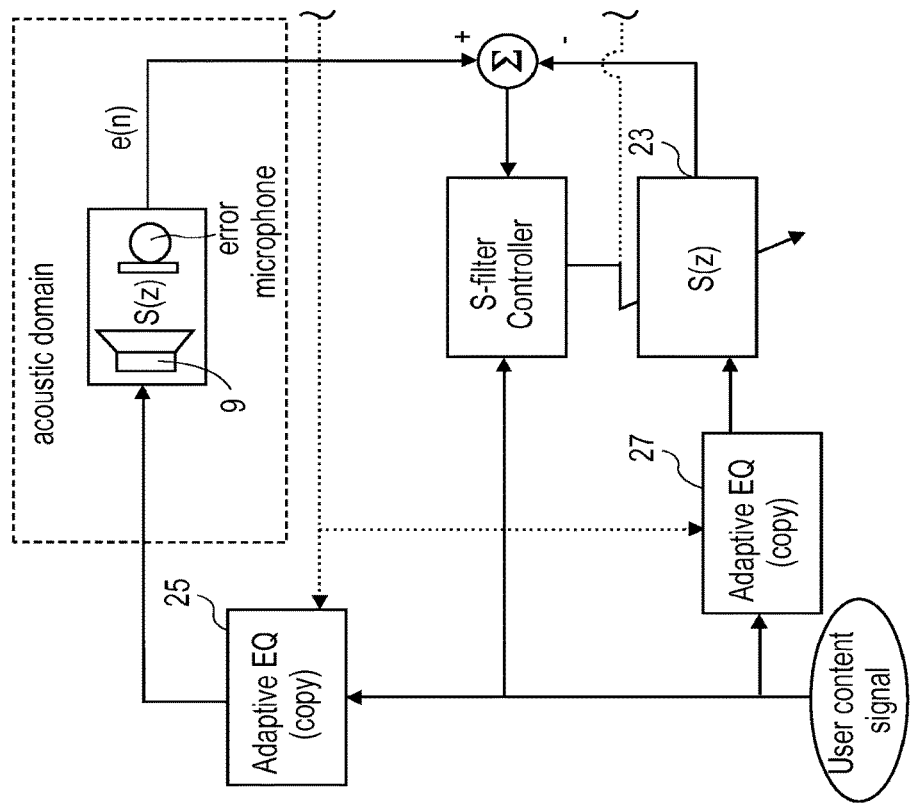
FIG. 4 is a block diagram of an audio processor with adaptive EQ filtering and that computes an S-filter.

FIG. 4 is a block diagram of an audio processor with special adaptive EQ filtering being applied to the user audio content signal to provide more consistent sound quality to the user (despite variable loading of the earpiece speaker 9), but without ANC. This is an example of how the adaptive EQ processor (of FIG. 3B, for example) can be used as a standalone unit, i.e. as part of an audio processor without ANC (in which case the reference microphone is not needed). In this case, the S-filter 23 is computed and adaptively updated as shown in FIG. 4, while simultaneously using an S(z) copy 30 of the S-filter 23 to adapt the EQ filter 26 as shown in FIG. 3B. The audio processor in FIG. 4 is similar to that of FIG. 3A except that the ANC functionality is absent by virtue of eliminating the W-filter W(z), the W-filter controller, and the path to the reference microphone through S(z) copy 29.

Figure 5:
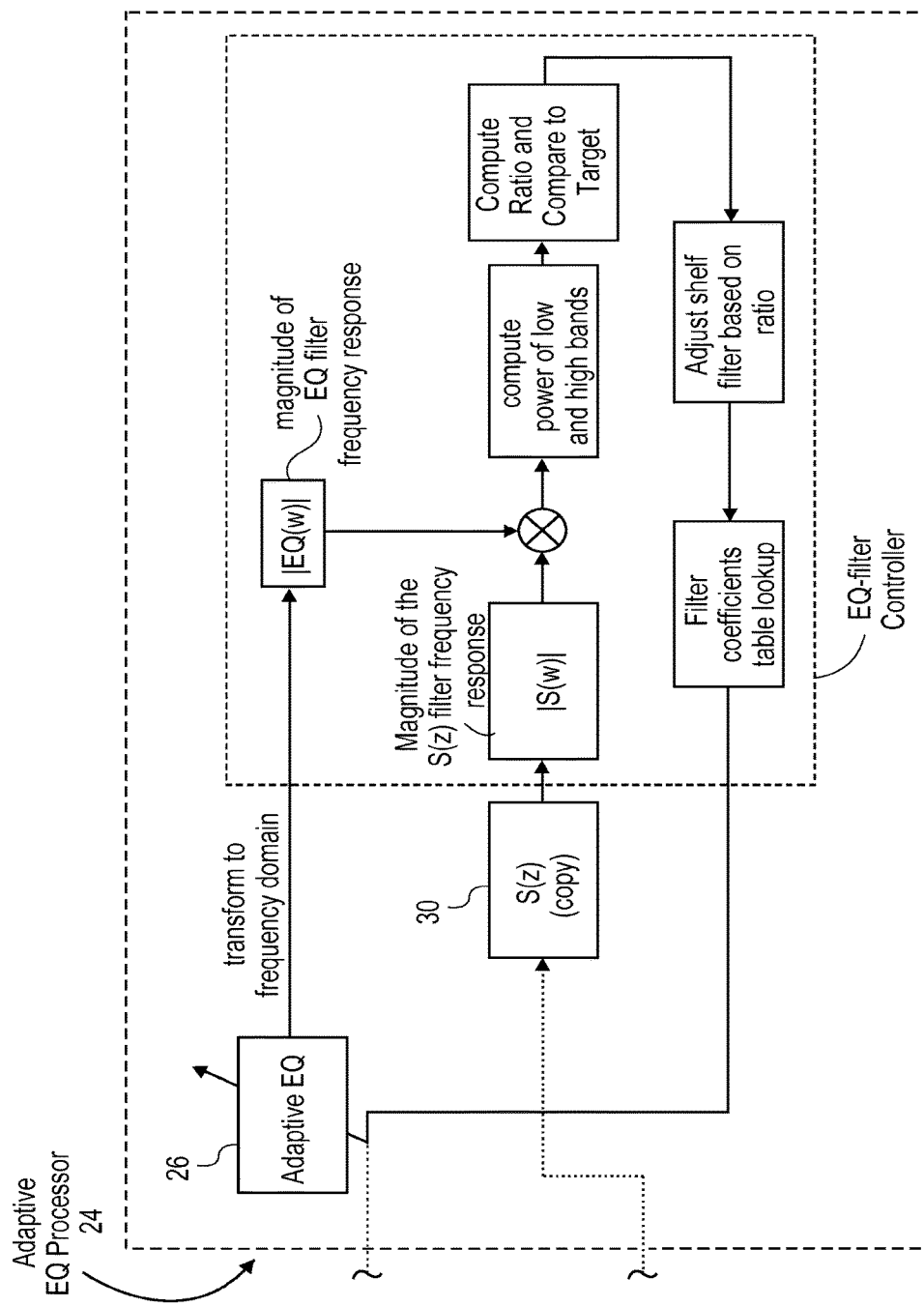
FIG. 5 is a block diagram of part of an audio processor that uses a copy of an S-filter and frequency domain signal processing within the EQ-filter controller.

FIG. 5 is a block diagram of part of an audio processor that uses frequency domain signal processing within its EQ-filter controller. This may be used as an alternative to the embodiment of FIG. 3B, for computing the adaptive EQ filter in real-time. In the embodiment of FIG. 3B however, the EQ filter controller may be implemented so as to operate entirely in time domain, i.e., without performing any time domain to frequency domain (and the reverse) transforms. In contrast, in FIG. 5, a frequency response of the S-filter is computed, e.g. by applying a Fast Fourier Transform algorithm or other suitable time domain to frequency domain transform upon the S-filter's impulse response, where the impulse response may be given by the present digital filter coefficients that are in a copy of the S-filter, namely S(z) copy 30. Also, a frequency response of the EQ-filter 26 is computed, for example using a similar technique as used for computing the frequency response of the S-filter. A magnitude frequency response is also computed for each, namely |S(w)| and |EQ(w)|, and are then multiplied by each other. Signal power in a low frequency band and in a high frequency band of the product is then computed. A comparison of the computed signal powers is then made, e.g. by computing a ratio of the computed signal powers and comparing the ratio to a desired or target ratio. This yields an adjustment value that applies to a variable or adaptive digital filter, for example a gain value of a variable gain low frequency shelf filter that is a constituent component of the adaptive EQ filter 26. The particular gain value is then used to perform a table lookup to find a predetermined set of digital filter coefficients that yield a frequency response having the gain value. The found filter coefficients are then applied to define the structure of the adaptive EQ filter 26.

Figure 6:
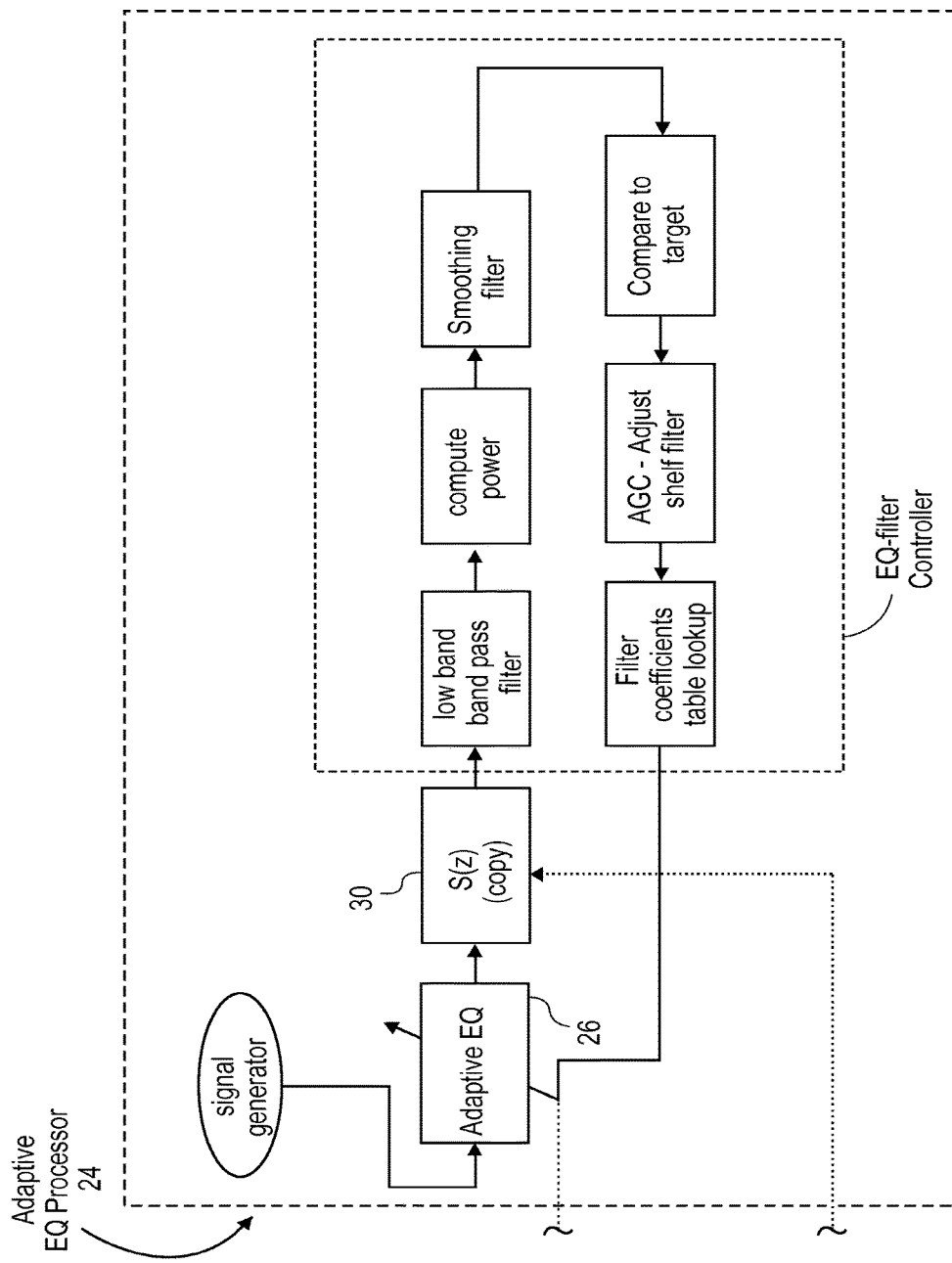
FIG. 6 is a block diagram of another adaptive EQ processor that uses a dummy signal and a copy of an S-filter, to update an adaptive EQ filter.

FIG. 6 is a block diagram of part of an audio processor that may be similar to that of FIG. 3B, and can be used as an alternative to the EQ filter controller of FIG. 3B, except that in this embodiment, it may be sufficient to consider only a single frequency band of the S- and EQ-filtered dummy signal. Here, signal power is computed only in a low frequency band (from the output of a bandpass filter that extracts only the low frequency band), smoothed over time (two or more sequential frames), and then compared to a target power. The adaptive EQ filter is then adjusted based on the difference between the target power and the computed low frequency band power. As an example, FIG. 6 shows that an automatic gain control (AGC) process may choose or select which shelf filter gain to use, in order to achieve the expected compensation in the low frequency band (of the audio user content that is presently being converted to sound by the speaker 9). The chosen shelf filter gain may then be used to perform a lookup in a predetermined table that associates a range of shelf filter gain values (e.g., such as those shown in FIG. 2B) with respective sets of digital filter coefficients, to obtain the set of digital filter coefficients that define the structure of the adaptive EQ filter so that it yields the desired frequency response (see also FIG. 2B for example low frequency shelving frequency response curves).

Figure 7:
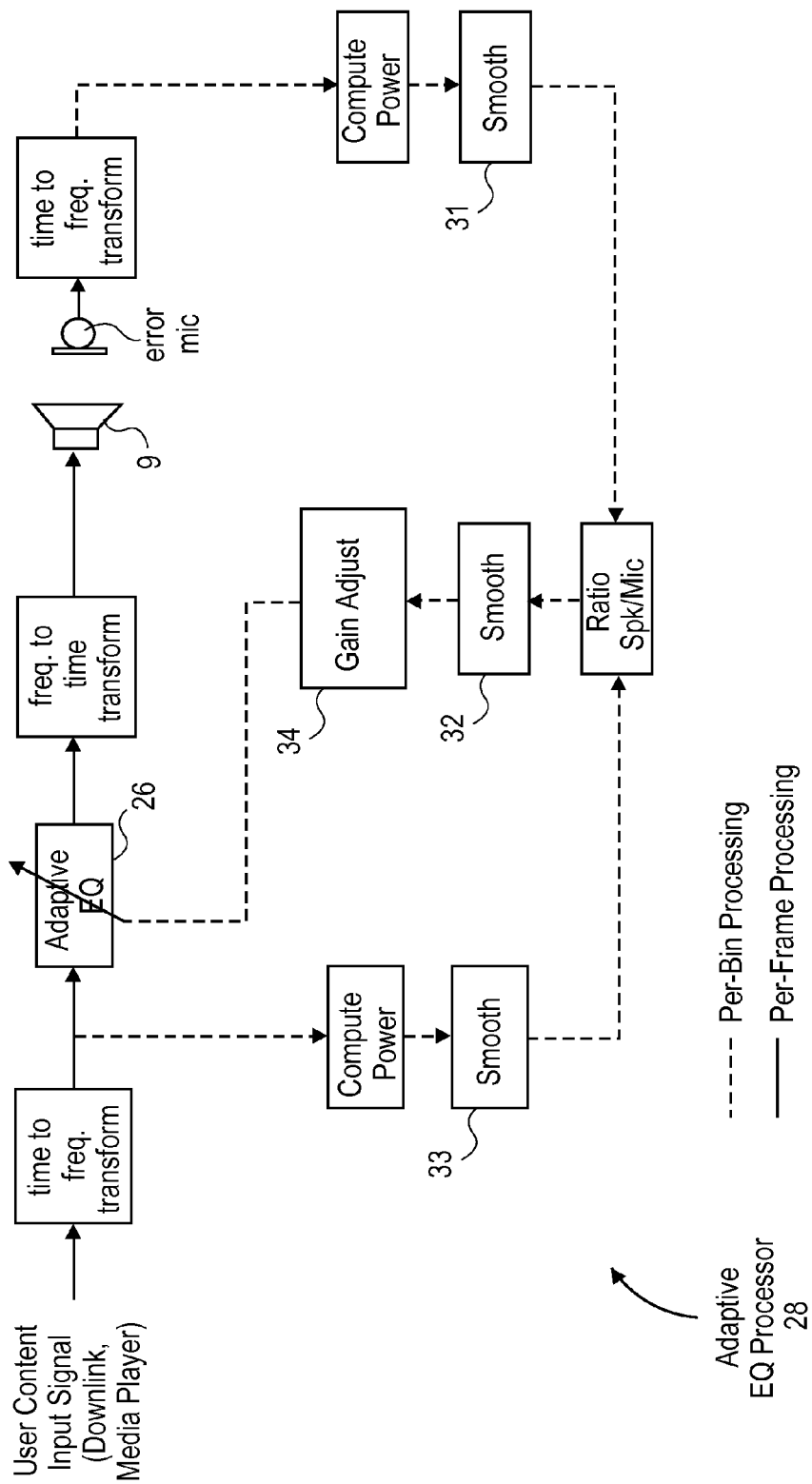
FIG. 7 is a block diagram of an adaptive EQ processor that uses frequency domain signal processing of the user audio content signal and an error microphone signal, to update the EQ filter.

Turning now to FIG. 7, this is a block diagram of an adaptive EQ processor 28 that performs frequency domain signal processing of the user audio content signal and the signal from the error microphone, to update the EQ filter 26. This embodiment is thus different from the EQ processor 24 of FIG. 3B, FIG. 5, or FIG. 6 at least because it does not rely upon a copy of the S-filter 23 (or an estimate of the earpiece speaker to error microphone transfer function), when computing the filter coefficients of the EQ filter 26. Here, much of the signal processing takes place in the frequency domain, where the user audio content signal is transformed to frequency domain before passing through the adaptive EQ filter 26 to obtain its correction, and then transformed back to time domain before being applied to drive the earpiece speaker 9. The correction by the EQ filter 26 may be applied on a per frequency bin basis, where in many practical situations the frequency bins of interest are in a low audio frequency band, i.e. below 2 kHz, although the technique in general could also be applied to other frequency bands.

Still referring to FIG. 7, both the user audio content signal and a signal from the error microphone are transformed into frequency domain, and then the following operations are performed on a per frequency bin basis, upon several selected bins (in a given digital audio frame or discrete-time sequence of the user audio content signal and of the signal from the error microphone). For each signal, its power is computed in a given bin. In one embodiment, a smoothing filter 33 may then be applied to the computed power values. This smoothing operation or filtering may have any one or both of two aspects. In particular, there can be smoothing over multiple sequential frames, i.e. over time, and/or there can be smoothing across frequency bins in the same frame. Example smoothing functions that may be used include exponential smoothing and averaging. The computed power values (or optionally smoothed power values) for a given bin are then compared, by for example computing their ratio, referred to in the drawing here as a speaker/mic ratio representing the ratio of the powers of the user audio content (prior to correction by the adaptive EQ filter 26) and the signal from the error microphone.

The power ratio values (per frequency bin) may then be optionally smoothed, across different bins in the same frame and/or across different frames for the same bin, by a further smoothing filter 32. The power ratio values (per frequency bin), or optionally smoothed versions of them, are provided to a gain adjuster 32 which adjusts the gain of the adaptive EQ filter 26, on a per frequency bin basis.

An embodiment of the invention may also be a machine-implemented or computerized method or process for digital audio processing in which an adaptive EQ process computes a correction that is applied to the audio user content (through a copy of an adaptive, special EQ filter) before feeding the speaker. This may yield improved sound quality that a user can hear during a voice or videophone call or during audio playback, from a personal listening device that forms a partial acoustic seal at the user's ear.

In one embodiment, an S-filter, which estimates a transfer function from an earpiece speaker (that is placed up against the ear of a user) to an error microphone, is initialized. Also, adaptive EQ filter is also initialized. This may be done by, for example, a suitably programmed digital signal processor that loads a separate, default set of digital filter coefficients for each one. The S-filter adaptation may be part of an ANC algorithm that can also be running at the same time, producing an anti noise signal for reducing ambient noise that can be heard by the user. FIG. 3A described above shows one way to compute, adapt or adjust the S-filter, which may be part of a combined adaptive EQ and ANC process. FIG. 4 shows another way to compute the S-filter, as part of a standalone adaptive EQ process without ANC.

When combined with the online ANC process, the S-filter is adjusted based on the audio user content and based on a signal from the error microphone. In one embodiment of the ANC process, the audio user content is passed through a copy of the EQ filter before being fed to an input of the S-filter (e.g., see FIG. 3A). While producing the anti-noise signal, an adaptive W-filter is adjusted based on an S-filtered signal from a reference microphone. In one embodiment, the anti-noise signal is combined with the audio user content coming from the copy of the EQ filter, before feeding the speaker.

The EQ filter may be computed, adapted, or adjusted in different ways. In one embodiment, a dummy signal is produced and passed through the adaptive EQ filter and also through a copy of the S-filter. The EQ filter is adjusted, based on the EQ- and S-filtered dummy signal. This process continues online or in real-time, during audio playback or during the phone call, and optionally during ANC in which the anti-noise signal is adjusted or adapted to changing ambient noise conditions. The user audio content signal is thus corrected or "equalized" (prior to being fed to the earpiece speaker) to yield a more consistent sound for the user despite varying acoustic seal conditions.

In one embodiment, the EQ filter is adjusted, based on the EQ- and S-filtered dummy signal, as follows. Signal power is computed in a low frequency band and in a high frequency band, of the EQ- and S-filtered dummy signal. The computed signal powers are compared, and one or more digital filter coefficients of the EQ filter are adjusted based on the comparison. This may be performed entirely in the time domain.

In another embodiment, the EQ filter is adjusted differently, this time using computations in the frequency domain and without the need for a dummy signal. For example as seen in FIG. 5, a frequency response of the S-filter is computed, e.g. by transforming the S-filter's impulse response from time domain into frequency domain, where the impulse response may be give by the S-filter's present digital filter coefficients. The magnitude of the computed frequency response of the S-filter is then multiplied by the magnitude of the present frequency response of the EQ filter. Signal powers in a low frequency band and in a high frequency band of the product are then computed. The computed signal powers are compared, and digital filter coefficients of the EQ filter are adjusted based on the comparison.

An embodiment of the invention may also be a machine-readable medium (such as microelectronic memory) having stored thereon instructions, which program one or more data processing components (generically referred to here as a "processor") to perform the digital audio processing operations described above including signal strength measurement, filtering, mixing, comparisons including ratio calculations, decision making and table lookups. In other embodiments, some of these operations might be performed by specific hardware components that contain hardwired logic (e.g., dedicated digital filter blocks). Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although the ANC processor depicted in FIG. 3A has an adaptive feed forward architecture suitable for a filtered-x LMS algorithm, the ANC processor may alternatively have a different architecture, such as adaptive feedback control or a hybrid feedback-feedward control. In addition, while FIG. 1 shows the audio source device 1 being a portable consumer electronic device, the audio processor may alternatively be implemented within a non-portable audio device such as, for example, a desktop computer or an in-room home entertainment system, or an in-vehicle entertainment system such as an automobile audio system or an aircraft passenger seat audio/visual system. Finally, it should also be noted that while FIG. 1 shows the audio system 10 being a personal listening device that has an accessory 8 in which the earpiece speaker 9 is located within an earphone housing, the audio processor, including the ANC and adaptive EQ processors, may also be useful in a cellular phone or a smartphone handset in which the earpiece speaker 9 is built into the housing of the host device 1 as a telephone handset "receiver". The description is thus to be regarded as illustrative instead of limiting.

What is claimed is:

1. An audio processor comprising:
    an adaptive S-filter which estimates a transfer function from an earpiece speaker, that is to be worn by a user, to an error microphone;
    a first copy of the adaptive S-filter;
    an S-filter controller to compute the adaptive S-filter and the first copy of the adaptive S-filter;
    an adaptive EQ filter which is to be used to correct user audio content being fed to the earpiece speaker and then heard by the user so as to compensate for variable acoustic sealing around the earpiece speaker against the user's ear;
    a first copy of the adaptive EQ filter which is to be used with the adaptive S-filter to filter the user audio content that is then used to produce an error signal from a signal from the error microphone;
    a signal generator to produce a dummy signal that is filtered by a second copy of the adaptive EQ filter and the first copy of the adaptive S-filter to produce a filtered dummy signal; and
    an EQ filter controller that is to adaptively adjust the adaptive EQ filter, the first copy of the adaptive EQ filter, and the second copy of the adaptive EQ filter based on the filtered dummy signal, while the user audio content is being filtered by the adaptive EQ filter before being fed to the earpiece speaker and then heard by the user;
    wherein the S-filter controller is further to adjust the adaptive S-filter and the first copy of the adaptive S-filter based on the user audio content and based on the error signal.

2. The audio processor of claim 1 wherein the dummy signal is one of a white noise signal and a pink noise signal.

3. The audio processor of claim 1 wherein the EQ filter controller is to compute signal power in a frequency band of the filtered dummy signal that is below 2 kHz, and based on a comparison of the computed signal power adjust gain of a shelf filter being a constituent filter block of the adaptive EQ filter.

4. The audio processor of claim 3 wherein the EQ filter controller is to smooth the computed signal power over time before comparing to a target, based on which the gain of the shelf filter is adjusted.

5. The audio processor of claim 3 wherein the shelf filter is a low frequency shelf filter that has variable gain in a low frequency band and essentially zero gain in a high frequency band.

6. The audio processor of claim 1 further comprising an adaptive W-filter to produce an anti-noise signal for reducing ambient noise that can be heard by the user, a W-filter controller coupled to adjust the adaptive W-filter, and a second copy of the adaptive S-filter through which a signal from a reference microphone is to pass before being fed to an input of the W-filter controller.

7. The audio processor of claim 6 wherein the anti-noise signal is combined with the user audio content coming from the adaptive EQ filter, before being fed to the earpiece speaker.

8. The audio processor of claim 7 wherein the EQ filter controller computes signal power in a low frequency band and signal power in a high frequency band of the filtered dummy signal, and based on a comparison of the computed signal powers in the low and high frequency bands adjusts gain of a shelf filter being a constituent filter block of the adaptive EQ filter.

9. A method for audio processing, comprising:
    initializing an adaptive S-filter which is to be used to estimate a transfer function from an earpiece speaker, that is being used by a user, to an error microphone;
    making a first copy of the adaptive S-filter;
    initializing an adaptive EQ filter which is to be used to correct user audio content being fed to the earpiece speaker and then heard by the user so as to compensate for variable acoustic sealing around the earpiece speaker against the user's ear;
    making a first copy of the adaptive EQ filter;

filtering the user audio content in accordance with the first copy of the adaptive EQ filter and the adaptive S-filter, and then using the filtered user audio content to produce an error signal from a signal from the error microphone;

producing a dummy signal;

filtering the dummy signal by passing the dummy signal through a second copy of the adaptive EQ filter and the first copy of the adaptive S-filter to produce a filtered dummy signal;

adjusting the adaptive EQ filter, the first copy of the adaptive EQ filter, and the second copy of the adaptive EQ filter based on the filtered dummy signal, while the user audio content being fed to the earpiece speaker is corrected in accordance with the adaptive EQ filter; and adjusting the adaptive S-filter and the first copy of the adaptive S-filter based on the user audio content and based on the error signal.

10. The method of claim 9 wherein adjusting the adaptive EQ filter based on the filtered dummy signal comprises:
computing signal power in a low frequency band and signal power in a high frequency band of the filtered dummy signal;
comparing the computed signal powers; and
adjusting a digital filter coefficient of the adaptive EQ filter, the first copy of the adaptive EQ filter, and the second copy of the adaptive EQ filter based on the comparison.

11. The method of claim 9 wherein adjusting the adaptive EQ filter based on the filtered dummy signal comprises:
computing signal power in a frequency band of the filtered dummy signal;
comparing the computed signal power with a target; and
adjusting a digital filter coefficient of the adaptive EQ filter, the first copy of the adaptive EQ filter, and the second copy of the adaptive EQ filter based on the comparison.

12. The method of claim 9 further comprising:
producing an anti-noise signal for reducing ambient noise that can be heard by the user; and
filtering a signal from a reference microphone in accordance with a second copy of the adaptive S-filter; and
adjusting the anti-noise signal based on the error signal.

13. The method of claim 12 further comprising:
combining the anti-noise signal with the user audio content that has been corrected in accordance with the adaptive EQ filter, before feeding the earpiece speaker.

14. An audio device that can perform online adaptive equalization (EQ) of user audio content, comprising:
an audio signal interface circuit that is to receive a first audio signal from an error microphone, and that is to send a second audio signal to an earpiece speaker;
an S-filter controller to compute an adaptive S-filter and a first copy of the adaptive S-filter, the adaptive S-filter estimating a transfer function from the earpiece speaker, that is being used by a user, to the error microphone;
an EQ filter controller that is to adjust an adaptive EQ filter, a first copy of the adaptive EQ filter, and a second copy of the adaptive EQ filter, while user audio content is being passed through the adaptive EQ filter before being sent to the earpiece speaker, the adaptive EQ filter being used to correct the user audio content being fed to the earpiece speaker and then heard by the user so as to compensate for variable acoustic sealing around the earpiece speaker against the user's ear, the first copy of the adaptive EQ filter being used with the adaptive S-filter to filter the user audio content that is then used to produce an error signal from the error microphone;

a signal generator to produce a dummy signal that is filtered by the second copy of the adaptive EQ filter and the first copy of the adaptive S-filter to produce a filtered dummy signal; and wherein the S-filter controller is to adjust the adaptive S-filter based on the user audio content and based on the first audio signal from the error microphone, while the user audio content is being passed through the first copy of the adaptive EQ filter and through the adaptive S-filter;

wherein the filtered dummy signal is then provided to the EQ filter controller, the EQ filter controller adaptively adjusts the adaptive EQ filter, the first copy of the adaptive EQ filter, and the second copy of the adaptive EQ filter based on the filtered dummy signal.

15. The audio device of claim 14 further comprising an accessory connector into which a wired headset can be plugged,
wherein the audio signal interface circuit comprises receiving circuitry that is coupled to the accessory connector to receive the first audio signal from the error microphone when the wired headset has been plugged in, and sending circuitry that is coupled to the accessory connector to send the second audio signal to the earpiece speaker when the wired headset has been plugged in.

16. The audio device of claim 15 in combination with the wired headset.

17. The audio device of claim 14 wherein the EQ filter controller is to perform operations comprising:
per frequency bin digital signal processing of the user audio content before the user audio content is corrected by the adaptive EQ filter, and of the first audio signal from the error microphone,
computing powers of the user audio content and of the first audio signal from the error microphone in a frequency bin,
comparing the computed powers of the user audio content and of the first audio signal from the error microphone in the frequency bin, and
adjusting a gain of the adaptive EQ filter, the first copy of the adaptive EQ filter, and the second copy of the adaptive EQ filter in the frequency bin based on the comparison of the computed powers of the user audio content and of the first audio signal from the error microphone in the frequency bin.

* * * * *